(12) United States Patent
Yang

(10) Patent No.: US 10,008,930 B1
(45) Date of Patent: Jun. 26, 2018

(54) BOOTSTRAP CIRCUIT AND ASSOCIATED DIRECT CURRENT-TO-DIRECT CURRENT CONVERTER APPLYING THE BOOTSTRAP CIRCUIT

(71) Applicant: Elite Semiconductor Memory Technology Inc., Hsinchu (TW)

(72) Inventor: Yao-Wei Yang, Changhua County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days. days.

(21) Appl. No.: 15/806,307

(22) Filed: Nov. 7, 2017

(51) Int. Cl.
| G05F 1/10 | (2006.01) |
| H02M 3/157 | (2006.01) |
| H03K 5/12 | (2006.01) |
| H02M 3/158 | (2006.01) |
| H03K 17/687 | (2006.01) |
| H03K 5/08 | (2006.01) |

(52) U.S. Cl.
CPC .......... *H02M 3/157* (2013.01); *H02M 3/158* (2013.01); *H03K 5/08* (2013.01); *H03K 5/12* (2013.01); *H03K 17/6871* (2013.01)

(58) Field of Classification Search
CPC ......... H02M 3/1588; H02M 2001/009; H02M 3/156; H02M 2001/0054; H02M 1/1588; G05F 1/00
USPC .................. 323/222, 224, 235, 268, 282–286
See application file for complete search history.

(56) References Cited

U.S. PATENT DOCUMENTS

| 8,264,807 | B2* | 9/2012 | Hong ..................... H03K 17/22 323/282 |
| 8,415,932 | B2* | 4/2013 | Kobayashi ............ H02M 3/156 323/222 |
| 8,536,808 | B2* | 9/2013 | Sarig ....................... H02M 1/36 315/360 |
| 2007/0170897 | A1* | 7/2007 | Williams ............ H01L 29/8128 323/222 |
| 2011/0316508 | A1* | 12/2011 | Cheng ..................... H02M 1/14 323/282 |

* cited by examiner

*Primary Examiner* — Rajnikant Patel
(74) *Attorney, Agent, or Firm* — Winston Hsu

(57) ABSTRACT

A bootstrap circuit applied to a first transistor of a direct-current (DC) to DC converter includes a second transistor, a bootstrapping capacitor and a clamping circuit, wherein the bootstrapping capacitor has a first terminal and a second terminal, and the first terminal is coupled to a source terminal of a transistor, and the source terminal of the second transistor is coupled to the first transistor; and the clamping circuit is coupled between a gate terminal of the second transistor and the second terminal of the bootstrapping capacitor, and is arranged to maintain a voltage drop between the second terminal of the bootstrapping capacitor and the gate terminal of the second transistor. A drain terminal of the second transistor is coupled to a first reference voltage, and a maximum of a voltage level of the gate terminal of the first transistor is greater than the first reference voltage.

20 Claims, 2 Drawing Sheets

US 10,008,930 B1

BOOTSTRAP CIRCUIT AND ASSOCIATED DIRECT CURRENT-TO-DIRECT CURRENT CONVERTER APPLYING THE BOOTSTRAP CIRCUIT

BACKGROUND OF THE INVENTION

1. Field of the Invention

The present invention relates to a bootstrap circuit and an associated direct current (DC)-to-DC converter applying the bootstrap circuit.

2. Description of the Prior Art

In a buck converter, the output voltage is a voltage stepped down from the input voltage by switching on/off switches installed therein to provide current to the inductor and the capacitor, wherein the input voltage is the highest voltage in the circuitry. In addition, for a buck converter with a high input voltage, in order to save the consumed area and acquire the wanted turned on resistor, N-type transistor is usually utilized which has a relatively low voltage drop between the gate terminal and the source terminal and a relatively high voltage drop between the drain terminal and the source terminal. To turn on the N-type transistors, a voltage level of a gate terminal of a transistor should be the highest voltage among the gate, source, and drain terminal. Therefore, it is difficult for the transistor to be turned on when the source terminal is charged to the input voltage, since the voltage level of the gate terminal will not be able to be higher without assistance. This results in a poor performance.

SUMMARY OF THE INVENTION

One of the objectives of the present invention is to provide a bootstrap circuit and an associated DC-to-DC converter to solve the abovementioned problem.

According to an embodiment of the present invention, a bootstrap circuit applied to a first transistor of a direct-current (DC) to DC converter is disclosed, comprising: a second transistor, a bootstrapping capacitor and a clamping circuit, wherein the bootstrapping capacitor has a first terminal and a second terminal, and the first terminal is coupled to a source terminal of the second transistor and the source terminal of the second transistor is coupled to the first transistor; and the clamping circuit is coupled between a gate terminal of the second transistor and the second terminal of the bootstrapping capacitor, and arranged to maintain a voltage drop between the second terminal of the bootstrapping capacitor and the gate terminal of the second transistor. A drain terminal of the second transistor is coupled to a first reference voltage, and a maximum of a voltage level of a gate terminal of the first transistor is greater than the first reference voltage.

According to an embodiment of the present invention, a DC-to-DC converter is disclosed, comprising: a switching circuit, an inductor-capacitor circuit, a feedback circuit and a bootstrap circuit. The switching comprises a first transistor and a second transistor, wherein a switching terminal is coupled between a source terminal of the first transistor and a drain terminal of the second transistor, and a drain terminal of the first transistor is coupled to a first reference voltage. The inductor-capacitor circuit comprises at least an inductor and a capacitor, and is arranged to receive an inductor current from the first reference voltage source via the switching circuit to provide energy to a following loading. The feedback circuit, which is coupled to the inductor-capacitor circuit, is arranged to generate an output voltage at an output terminal and a feedback voltage. The bootstrap circuit comprises a third transistor, a bootstrapping capacitor and a clamping circuit, wherein a source terminal of the third transistor is coupled to the first transistor, the bootstrapping capacitor has a first terminal and a second terminal, and the first terminal is coupled to the source terminal of the third transistor; and the clamping circuit is coupled between a gate terminal of the third transistor and the second terminal of the bootstrapping capacitor, and is arranged to maintain a voltage drop between the second terminal of the bootstrapping capacitor and the gate terminal of the third transistor. A drain terminal of the third transistor is coupled to a first reference voltage, and a maximum of a voltage level of the gate terminal of the transistor is greater than the first reference voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
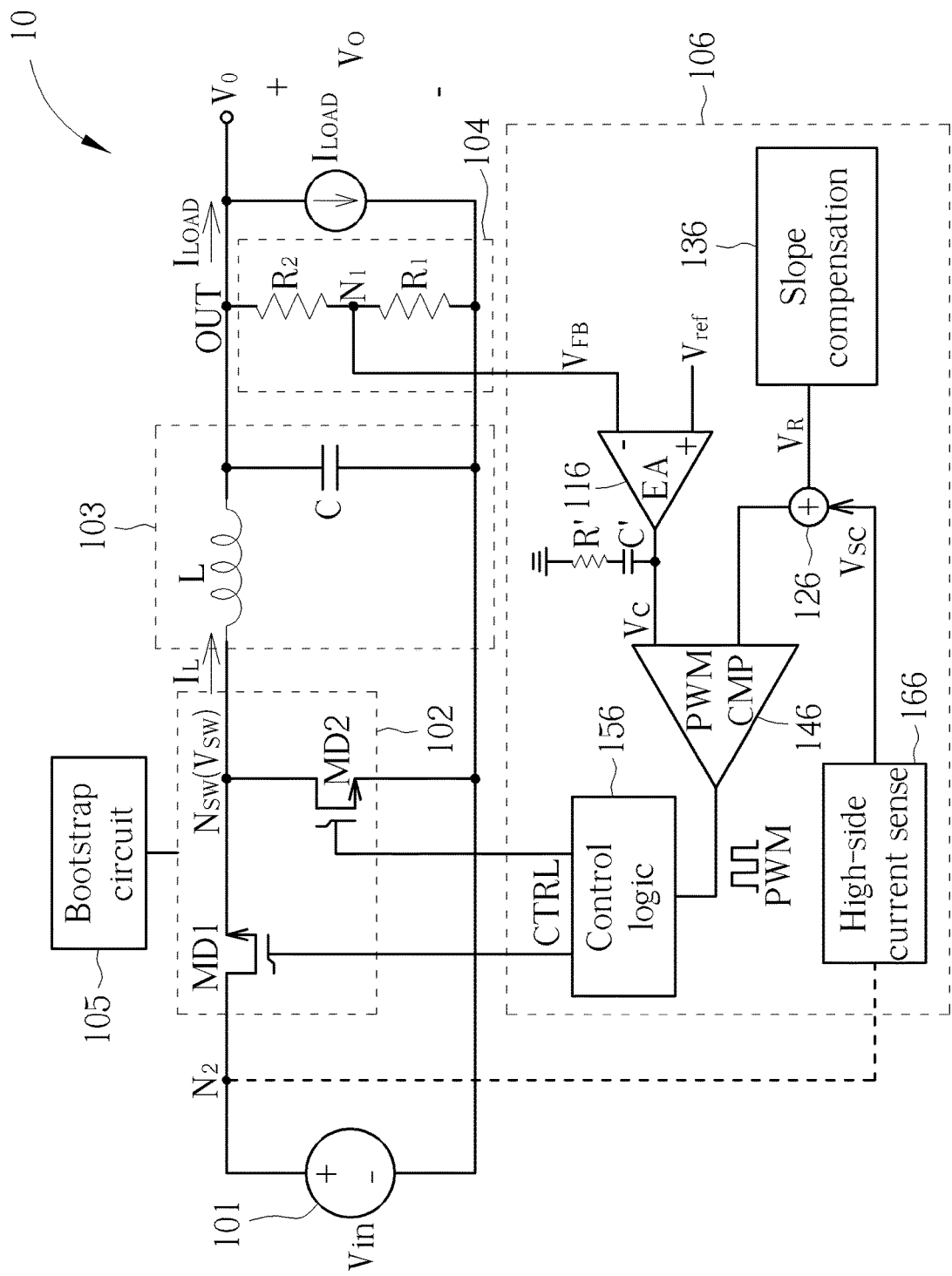
FIG. 1 is a diagram illustrating a buck converter applying a bootstrap circuit according to an embodiment of the present invention.

As mentioned in the prior art, a bootstrap circuit is desired for a DC-to-DC converter such as a buck converter. FIG. 1 illustrates a current mode buck converter 10 applying a bootstrap circuit 105 as an example. The current mode buck converter 10 comprises: an input voltage source 101 for providing an input voltage $V_{in}$; a switching circuit 102 comprising transistors MD1 and MD2 implemented as switches; an inductor-capacitor circuit 103 comprising an inductor L and a capacitor C for receiving an inductor current $I_L$ from the input voltage source 101 via the switching circuit 102 to provide energy to a following loading; a feedback circuit 104 comprising resistors $R_1$ and $R_2$ for generating a feedback voltage $V_{FB}$ at a terminal $N_1$ coupled between the resistors $R_1$ and $R_2$ and an output voltage $V_o$ at an output terminal OUT according to the inductor current $I_L$ and a loading current $I_{load}$. As shown in FIG. 1, the switching circuit 102 further comprises a switching terminal $N_{SW}$ coupled between a source terminal of the transistor MD1 and a drain terminal of the transistor MD2; a voltage level on the switching terminal is marked as $V_{SW}$ in FIG. 1. In this embodiment, the transistors MD1 and MD2 are implemented by N channel Metal Oxide Semiconductor Field Effect Transistors (MOSFETs) due to their low turn on resistance, which can reduce the consumed area of the transistor when the turn on resistance is lower than a predetermined value. This is only for illustrative purposes, however, and not a limitation of the present invention. In other embodiment, the transistors MD1 and MD2 can be implemented by different kinds of transistors. Furthermore, in other embodiments, the transistor MD2 can be replaced by a Schottky diode as a switch which is not a limitation of the present invention.

The bootstrap circuit 105 is coupled to the switching circuit 102 for elevating the voltage level on the gate terminal of the transistor MD1. The bootstrap circuit 105 will be discussed in the following paragraphs. The current mode buck converter 10 may further comprise a peak current mode controller circuit 106. The peak current mode controller circuit 106 comprises: an error amplifier 116 including a negative input terminal for receiving the feedback voltage $V_{FB}$ and a positive input terminal for receiving a reference voltage $V_{ref}$ to generate an output voltage $V_C$ on an output terminal of the error amplifier 116; an adder 126 for receiving a current sensing voltage $V_{cs}$ generated by sensing the current on a terminal $N_2$ through a high-side current sense circuit 166 and a ramp voltage $V_R$ generated from a slope compensation circuit 136; a pulse width modulation (PWM) comparator 146 for generating a PWM signal at an output of the PWM comparator 146; a control logic circuit 156 for generating a control signal CTRL to the switching circuit 102 for controlling the switches MD1 and MD2 according to the PWM signal, wherein in this embodiment, the control logic circuit 156 may comprise a buffer 156_1 which receives the PWM signal and generates and sends the control signal CTRL to the switches MD1 the switching circuit 102; and a resistor R' and a capacitor C' connected in series at the output terminal of the error amplifier 116, wherein the resistor R' and the capacitor C' constitute a compensation circuit. However, the compensation circuit is not limited to be implemented by the resistor R' and the capacitor C'. Those skilled in the art must understand the compensation circuit can be implemented by different architecture. The current mode buck converter 10 with the slope compensation mechanism should be well-known to those skilled in the art.

This invention focuses on the bootstrap circuit 105 having the ability of elevating the voltage level on the gate terminal of the transistor MD1 in order to solve the problems of the prior art. Please note that the bootstrap circuit 105 disclosed by the present invention is not limited to be applied to a buck converter as depicted in FIG. 1.

Figure 2:
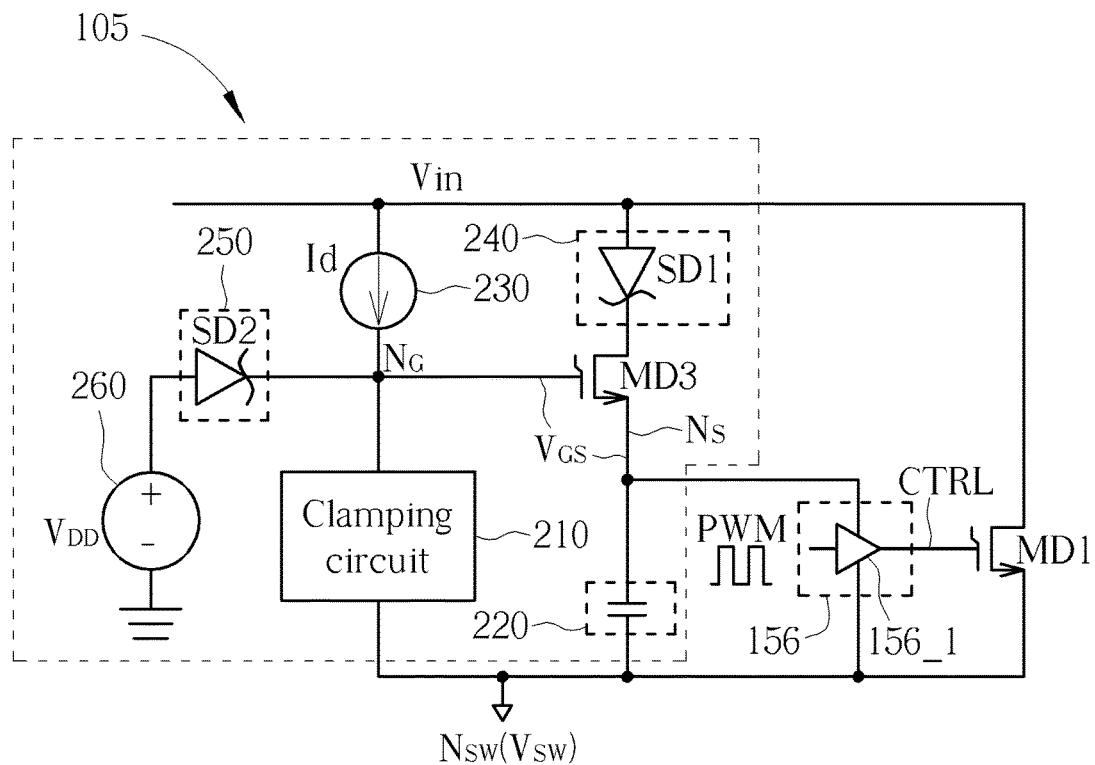
FIG. 2 is a diagram illustrating the bootstrap circuit according to an embodiment of the present invention.

FIG. 2 is a diagram illustrating the bootstrap circuit 105 coupled to the transistor MD1 of the switching circuit 102 according to an embodiment of the present invention. As shown in FIG. 2, the bootstrap circuit 105 comprises a transistor MD3, a clamping circuit 210, a bootstrapping capacitor 220, a driving current source 230, voltage regulating circuits 240 and 250, and a voltage source 260. The clamping circuit 210 is coupled between the gate terminal of the transistor MD3 and the switching terminal $N_{SW}$ for maintaining the voltage drop between these two terminals. The bootstrapping capacitor 220 is coupled between the source terminal $N_S$ of the transistor MD3 and the switching terminal $N_{SW}$ for receiving a current from the input voltage $V_{in}$, and is charged to elevate the voltage level on the source terminal $N_S$. The driving current source 230 is coupled between the gate terminal $N_G$ of the transistor MD3 and the input voltage $V_{in}$ for providing a driving current $I_d$. The voltage regulating circuit 240 comprising a Schottky diode SD1 is coupled between the drain terminal of the transistor MD3 and the input voltage $V_{in}$. With the Schottky diode SD1 coupling to the drain terminal of the transistor MD3, the transistor MD3 can easily stay in the saturation stage for providing a stronger current to the bootstrapping capacitor 220. The voltage regulating circuit 250 comprising a Schottky diode SD2 is coupled between the gate terminal $N_G$ and the voltage source 260. The voltage source 260 is coupled between the voltage regulating circuit 250 and a reference voltage (e.g. a ground voltage) for providing a reference voltage $V_{DD}$. As shown in FIG. 2, the source terminal $N_S$ is coupled to the buffer 156_1 of the control logic circuit 156, wherein the buffer 156_1 receives the PWM signal, and generates and sends the control signal CTRL to the gate terminal of the transistor MD1. By providing a stable energy to the bootstrapping capacitor 220 via said stronger current through the transistor MD3, the control logic circuit 156 can easily control the voltage level on the gate terminal of the transistor MD1 to be elevated above the input voltage $V_{in}$ to solve the problem mentioned in the prior art.

Figure 3:
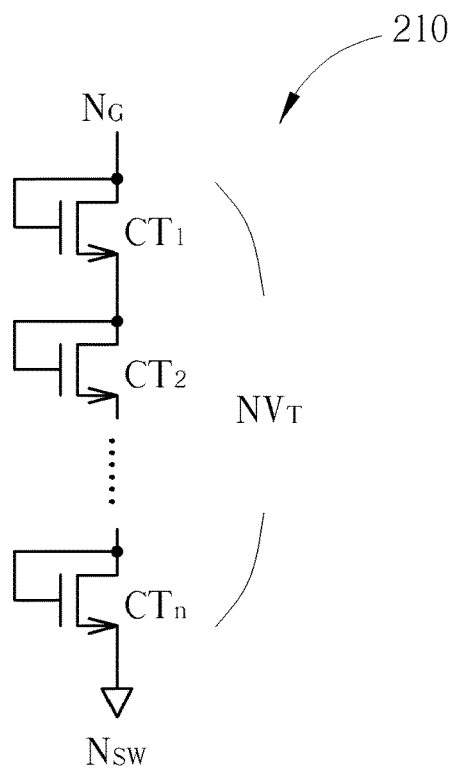
FIG. 3 is a diagram illustrating the clamping circuit according to an embodiment of the present invention.

FIG. 3 is a diagram illustrating the clamping circuit 210 according to an embodiment of the present invention. As shown in FIG. 3, the clamping circuit 210 comprises a plurality of clamping transistors $CT_1$-$CT_n$, wherein each of the plurality of clamping transistors $CT_1$-$CT_n$ is implemented by a diode-connected transistor, i.e. the gate terminal is coupled to the drain terminal, and the plurality of clamping transistors $CT_1$-$CT_n$ connects in series. In this embodiment, each of the plurality of clamping transistors $CT_1$-$CT_n$ has the same threshold voltage $V_t$, and the voltage drop between the gate terminal $N_G$ of the transistor MD3 and the switching terminal $N_{SW}$ is $NV_t$. This is only for illustrative purposes; in other embodiments, the threshold voltage of each of the plurality of clamping transistors $CT_1$-$CT_n$ is not limited to be the same. Please note that the reference voltage $V_{DD}$ is designed to be greater than the voltage drop $NV_t$ located between the gate terminal $N_G$ of the transistor MD3 and the switching terminal $N_{SW}$, i.e. $V_{DD}>NV_t$. With the assistance of the bootstrap circuit 105 disclosed by the present invention, the bootstrapping capacitor 220 can be charged under the following conditions:

(1) When the voltage level $V_{SW}$ on the switching terminal $N_{SW}$ is greater than 0 and the voltage level $V_{SW}$ plus the voltage drop $NV_t$ is smaller than the reference voltage $V_{DD}$, i.e. $V_{SW}>0$, $V_{SW}+NV_t<V_{DD}$, the voltage drop across the bootstrapping capacitor 220 is $V_{DD}-V_{SW}-V_{GS}$, wherein $V_{GS}$ is the voltage drop between the gate terminal $N_G$ and the source terminal $N_S$.

(2) When the voltage level $V_{SW}$ on the switching terminal $N_{SW}$ is greater than 0, and the voltage level $V_{SW}$ plus the voltage drop $NV_t$ is greater than the reference voltage $V_{DD}$, i.e. $V_{SW}>0$, $V_{SW}+NV_t>V_{DD}$, the voltage drop across the bootstrapping capacitor 220 is $NV_t-V_{GS}$.

(3) When the voltage level $V_{SW}$ on the switching terminal $N_{SW}$ is near 0, the voltage drop across the bootstrapping capacitor 220 is $V_{DD}-V_{GS}$.

(4) When the voltage level $V_{SW}$ on the switching terminal $N_{SW}$ is smaller than 0, the voltage drop across the bootstrapping capacitor 220 is $V_{DD}-V_{SW}-V_{GS}$.

The bootstrapping capacitor 220 can be charged under all the above conditions except when the voltage level $V_{SW}$ is close to the input voltage $V_{in}$. Therefore, the performance of the bootstrap circuit 105 can be greatly improved. The voltage level on the gate terminal $N_G$ of the transistor MD3 can be effectively elevated with the help of the bootstrap circuit 105 whose maximum is potentially greater than the input voltage $V_{in}$. The problems of the prior art can thus be effectively solved.

Briefly summarized, the present invention discloses a bootstrap circuit which can effectively charge the bootstrapping capacitor 220 to provide a stable energy between the source terminal $N_S$ and the switching terminal $N_{SW}$, and the control logic circuit 156 can easily control the voltage level on the gate terminal of the transistor MD1 to be elevated above the input voltage $V_{in}$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bootstrap circuit applied to a first transistor of a direct-current (DC) to DC converter, comprising:
   a second transistor;
   a bootstrapping capacitor, having a first terminal and a second terminal, wherein the first terminal is coupled to a source terminal of the second transistor, and the source terminal of the second transistor is coupled to the first transistor; and
   a clamping circuit, coupled between a gate terminal of the second transistor and the second terminal of the bootstrapping capacitor, the clamping circuit being arranged to maintain a voltage drop between the second terminal of the bootstrapping capacitor and the gate terminal of the second transistor;
   wherein a drain terminal of the transistor is coupled to a first reference voltage, and a maximum of a voltage level of a gate terminal of the first transistor is greater than the first reference voltage.

2. The bootstrap circuit of claim 1, further comprising:
   a voltage regulating circuit, wherein the voltage regulating circuit is coupled between the drain terminal of the second transistor and the first reference voltage.

3. The bootstrap circuit of claim 2, wherein the voltage regulating circuit comprises a Schottky diode.

4. The bootstrap circuit of claim 1, further comprising:
   a driving current source, coupled between the first reference voltage and the clamping circuit.

5. The bootstrap circuit of claim 1, further comprising:
   a voltage regulating circuit, coupled between the gate terminal of the second transistor and a second reference voltage.

6. The bootstrap circuit of claim 5, wherein the voltage regulating circuit comprises a Schottky diode.

7. The bootstrap circuit of claim 1, wherein the clamping circuit comprises at least one clamping transistor.

8. The bootstrap circuit of claim 7, wherein a drain terminal of each clamping transistor is coupled to a gate terminal of each clamping transistor.

9. The bootstrap circuit of claim 7, further comprising:
   a voltage source, arranged to provide a second reference voltage, wherein the second reference voltage is greater than a predetermined value, and the predetermined value is a sum of a threshold voltage of each clamping transistor.

10. The bootstrap circuit of claim 9, wherein when the voltage level on the second terminal of the bootstrapping capacitor is greater than 0 and the second reference voltage is smaller than a sum of the voltage level on the second terminal of the bootstrapping capacitor and the predetermined value, the bootstrapping capacitor is charged with a voltage equal to the predetermined value minus a threshold voltage of the second transistor.

11. A direct current (DC)-to-DC converter, comprising:
   a switching circuit, comprising a first transistor and a second transistor, wherein a switching terminal is coupled between a source terminal of the first transistor and a drain terminal of the second transistor, and a drain terminal of the first transistor is coupled to a first reference voltage;
   an inductor-capacitor circuit, comprising at least an inductor and a capacitor, wherein the indictor-capacitor circuit is arranged to receive an inductor current from the first reference voltage source via the switching circuit to provide energy to a following loading;
   a feedback circuit, coupled to the inductor-capacitor circuit, wherein the feedback circuit is arranged to generate an output voltage at an output terminal and a feedback voltage; and
   a bootstrap circuit, comprising:
      a third transistor, wherein a source terminal of the third transistor is coupled to the first transistor;
      a clamping circuit, coupled between a gate terminal of the third transistor and the switching terminal, wherein the clamping circuit is arranged to clamp a voltage level on the switching terminal; and
      a bootstrapping capacitor, wherein the bootstrapping capacitor is coupled between the source terminal of the third transistor and the switching terminal;
   wherein a maximum of a voltage level of the gate terminal of the first transistor is greater than the first reference voltage.

12. The DC-to-DC converter of claim 11, wherein the bootstrap circuit further comprises:
   a voltage regulating circuit, wherein the voltage regulating circuit is coupled between the drain terminal of the third transistor and the first reference voltage.

13. The DC-to-DC converter of claim 12, wherein the voltage regulating circuit comprises a Schottky diode.

14. The DC-to-DC converter of claim 11, wherein the bootstrap circuit further comprises:
   a driving current source, coupled between the first reference voltage and the clamping circuit.

15. The DC-to-DC converter of claim 11, wherein the bootstrap circuit further comprises:
   a voltage regulating circuit coupled between the gate terminal of the third transistor and a second reference voltage.

16. The DC-to-DC converter of claim 15, wherein the voltage regulating circuit comprises a Schottky diode.

17. The DC-to-DC converter of claim 11, wherein the clamping circuit of the bootstrap circuit comprises at least one clamping transistor.

18. The DC-to-DC converter of claim 17, wherein a drain terminal of each clamping transistor is coupled to a gate terminal of each clamping transistor.

19. The DC-to-DC converter of claim 17, wherein the bootstrap circuit further comprises:
   a voltage source, arranged to provide a second reference voltage, wherein the second reference voltage is greater than a predetermined value, and the predetermined value is a sum of a threshold voltage of each clamping transistor.

20. The DC-to-DC converter of claim 19, wherein when the voltage level on the switching terminal is greater than 0 and the second reference voltage is smaller than a sum of the voltage level on the switching terminal and the predetermined value, the bootstrapping capacitor is charged with a voltage equal to the predetermined value minus a threshold voltage of the third transistor.

\* \* \* \* \*